(12) United States Patent
Kim et al.

(10) Patent No.: US 11,993,866 B2
(45) Date of Patent: May 28, 2024

(54) SUPER-AMPHIPHILIC FIBER-NANOWIRE COMPOSITE AND APPLICATION

(71) Applicant: KOREA UNIVERSITY RESEARCH AND BUSINESS FOUNDATION, Seoul (KR)

(72) Inventors: Young Keun Kim, Seoul (KR); Jung Bae Kim, Seoul (KR); Sang Won Byun, Seoul (KR); Bum Chul Park, Seoul (KR); Young Jun Ju, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/552,475

(22) Filed: Dec. 16, 2021

(65) Prior Publication Data
US 2022/0186402 A1    Jun. 16, 2022

(30) Foreign Application Priority Data

Dec. 16, 2020   (KR) .................. 10-2020-0176847

(51) Int. Cl.
*D01D 5/00*  (2006.01)
*D01D 1/02*  (2006.01)
(Continued)

(52) U.S. Cl.
CPC ............ *D01D 5/0007* (2013.01); *D01D 1/02* (2013.01); *D01F 1/02* (2013.01); *B82Y 30/00* (2013.01);
(Continued)

(58) Field of Classification Search
CPC ........... D01F 1/02; D01D 1/02; D01D 5/0007
See application file for complete search history.

(56) References Cited

U.S. PATENT DOCUMENTS

2008/0217807 A1* 9/2008 Lee ................. B01D 39/1623
156/227
2012/0003524 A1* 1/2012 Jo ..................... H01M 50/406
429/144
(Continued)

FOREIGN PATENT DOCUMENTS

| CN | 106521678 A | 3/2017 |
| CN | 107237043 A | 10/2017 |

(Continued)

OTHER PUBLICATIONS

KR10-2011-0083939 Machine Translation (Year: 2023).*
(Continued)

*Primary Examiner* — Emmanuel S Luk
(74) *Attorney, Agent, or Firm* — NSIP Law

(57) ABSTRACT

The present invention relates to a fiber-nanowire composite-based sheet having super-amphiphilic characteristics. In the present invention, fibers including metal nanoparticles or metal oxide nanoparticles embedded in the fibers or located on the surface of the fibers are synthesized, and a sheet based on a composite in which metal nanowires or metal oxide nanowires have been grown from the above fibers is provided.

A sheet of the present invention has super-amphiphilic characteristics and can be used in various fields such as the antibacterial filter field, the antibacterial film field, the antiviral filter field, the antiviral film field, the antifouling coating field, the drug delivery vehicle field, or the water treatment filter field.

9 Claims, 8 Drawing Sheets

(51) Int. Cl.
  *D01F 1/02* (2006.01)
  *B82Y 30/00* (2011.01)
  *B82Y 40/00* (2011.01)

(52) U.S. Cl.
  CPC .......... *B82Y 40/00* (2013.01); *D10B 2401/13* (2013.01); *D10B 2505/04* (2013.01)

(56) References Cited

U.S. PATENT DOCUMENTS

| | | | |
|---|---|---|---|
| 2014/0113144 A1* | 4/2014 | Loth | B08B 17/065 524/391 |
| 2017/0203256 A1* | 7/2017 | Chen | B01D 71/024 |
| 2018/0347075 A1 | 12/2018 | Kim et al. | |
| 2020/0087849 A1* | 3/2020 | Noor | D06M 23/10 |
| 2021/0366707 A1* | 11/2021 | Choi | H01L 23/53238 |

FOREIGN PATENT DOCUMENTS

| | | | | |
|---|---|---|---|---|
| EP | 2267199 A2 | * | 12/2010 | ......... B01D 39/2082 |
| EP | 2820710 B1 | * | 8/2019 | ........... D01D 5/0015 |
| JP | 2023505051 A | * | 2/2023 | ............... C25B 3/26 |
| KR | 20110083939 A | * | 7/2011 | |
| KR | 20150119697 A | * | 10/2015 | ............... D01F 9/12 |
| KR | 10-2019-0027346 A | | 3/2019 | |
| KR | 10-2113012 B1 | | 6/2020 | |
| KR | 20210131999 A | * | 11/2021 | ....... C25B 15/04574 |

OTHER PUBLICATIONS

Extended European search report dated May 16, 2022, in counterpart European Patent Application No. 21214961.1 (6 pages in English).

Korean Office Action dated Jul. 19, 2023, in counterpart Korean Patent Application No. 10-2021-0180587 (6 pages in Korean).

* cited by examiner

[FIG. 1]
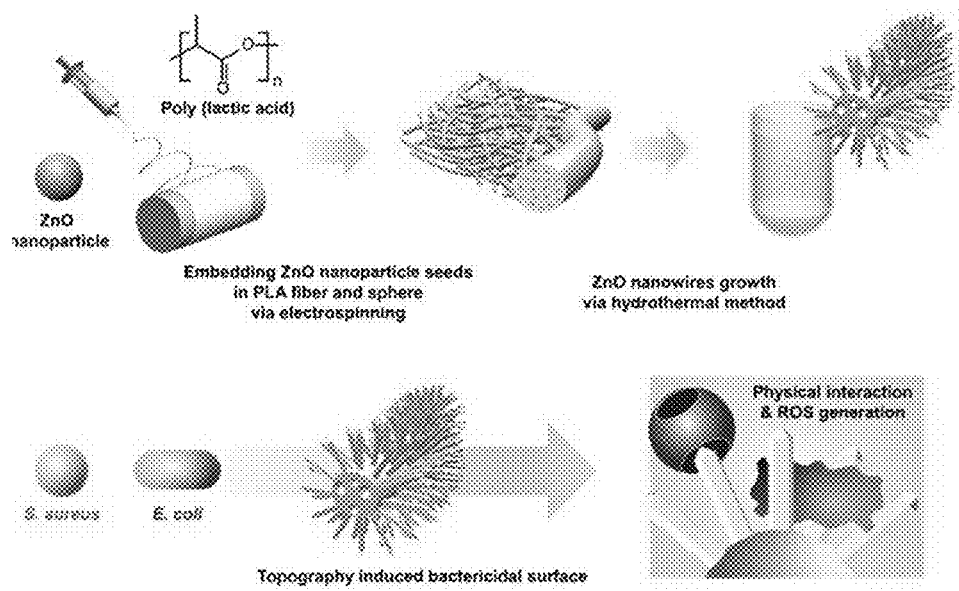
[FIG. 2]
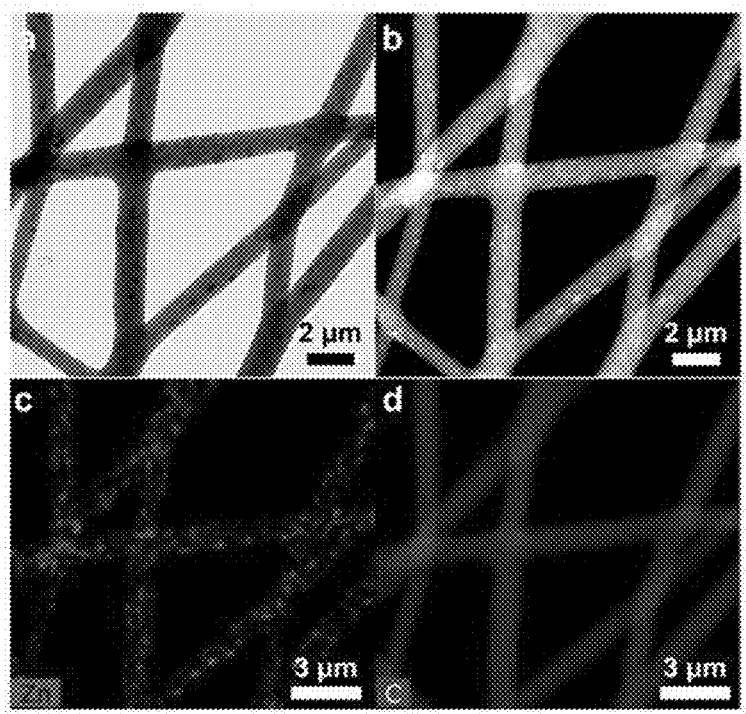

[FIG. 3]
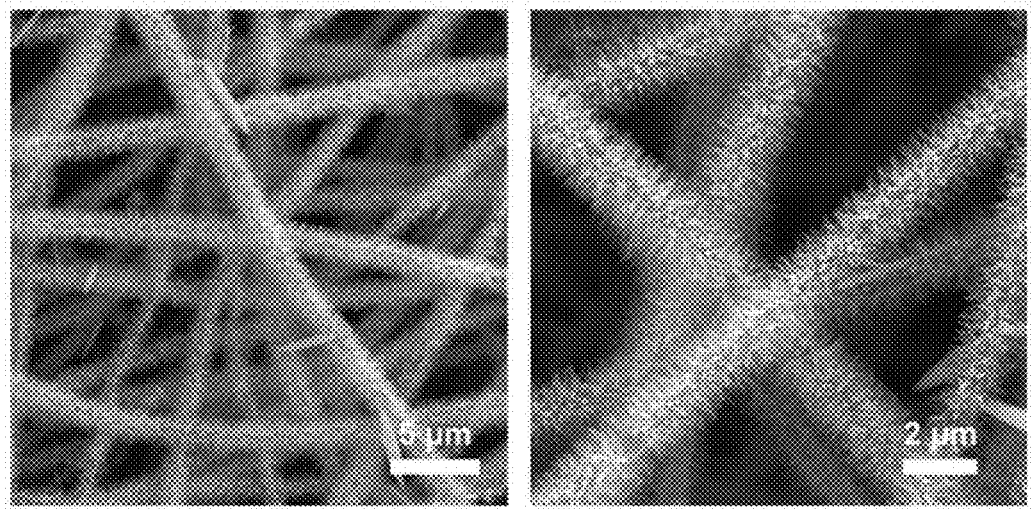
[FIG. 4]
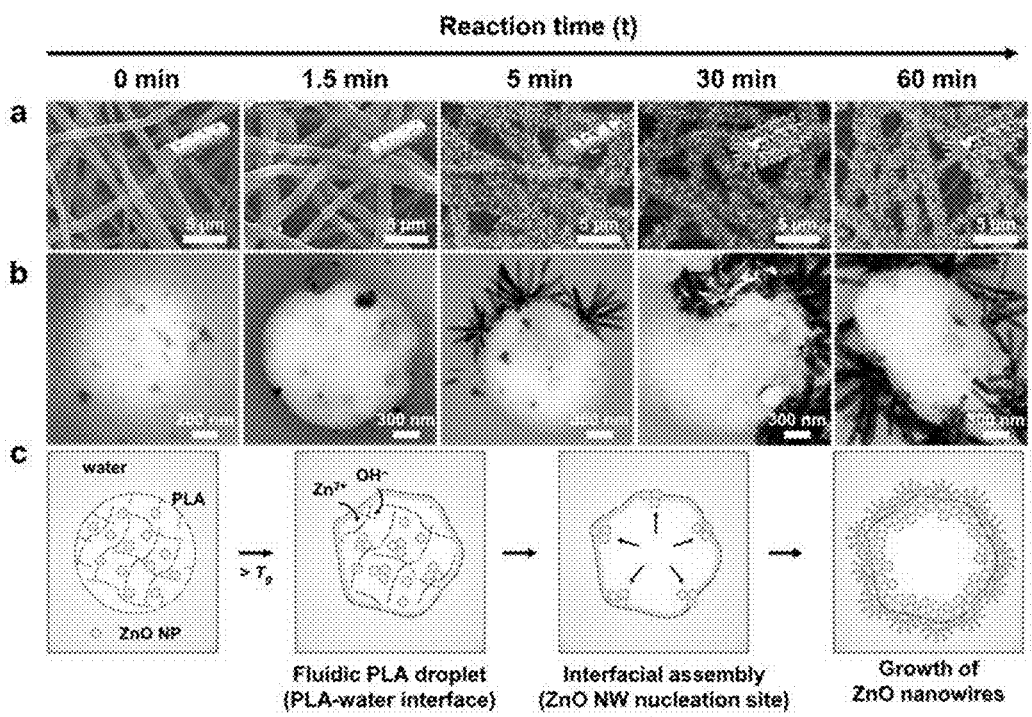

[FIG. 5]
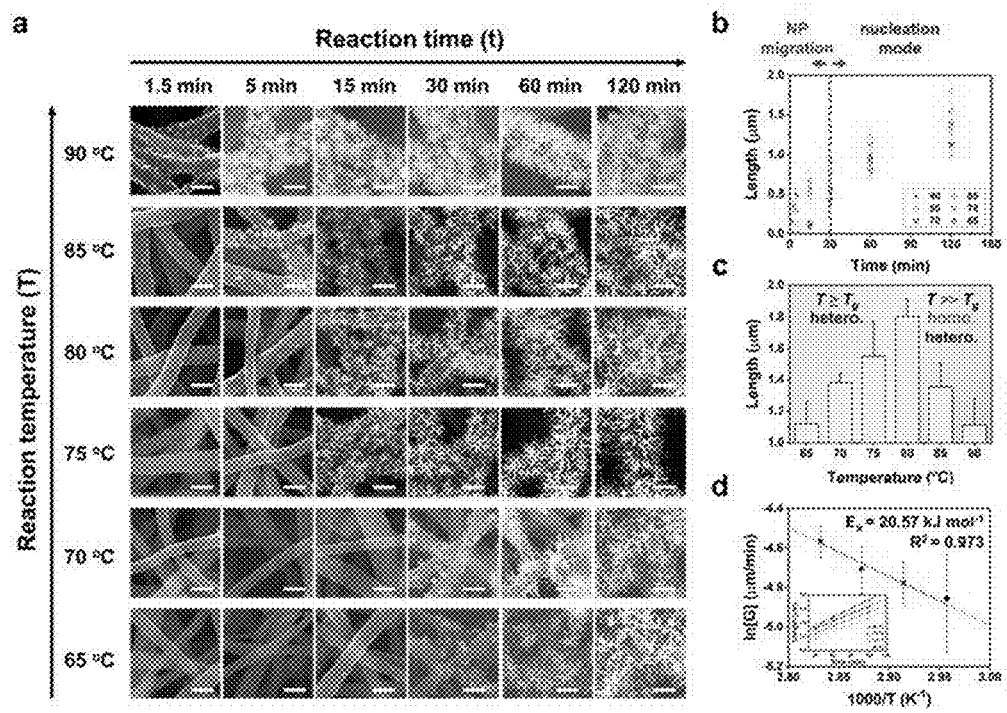
[FIG. 6a]
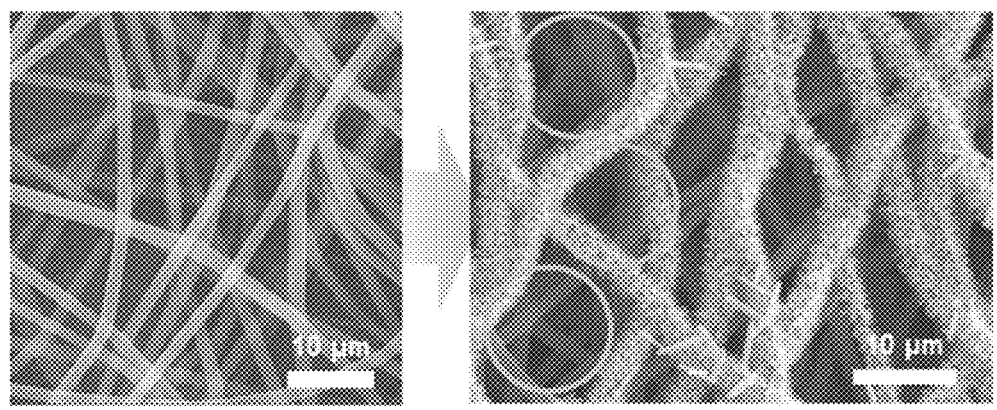

[FIG. 6b]
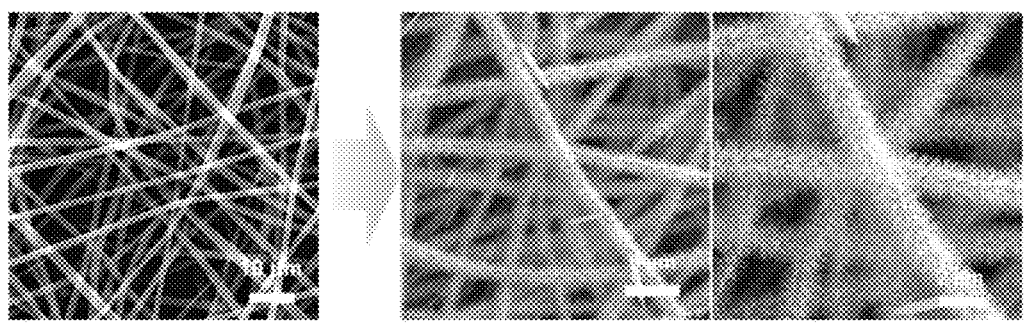
[FIG. 7]
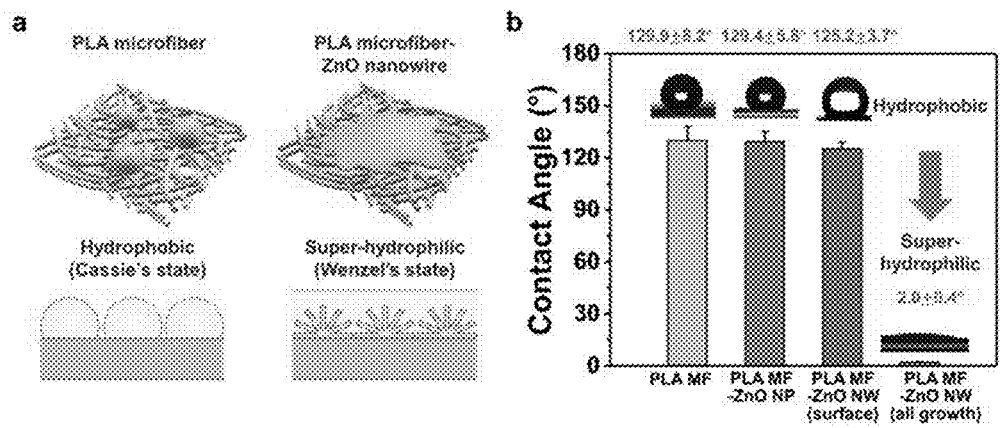

[FIG. 8]
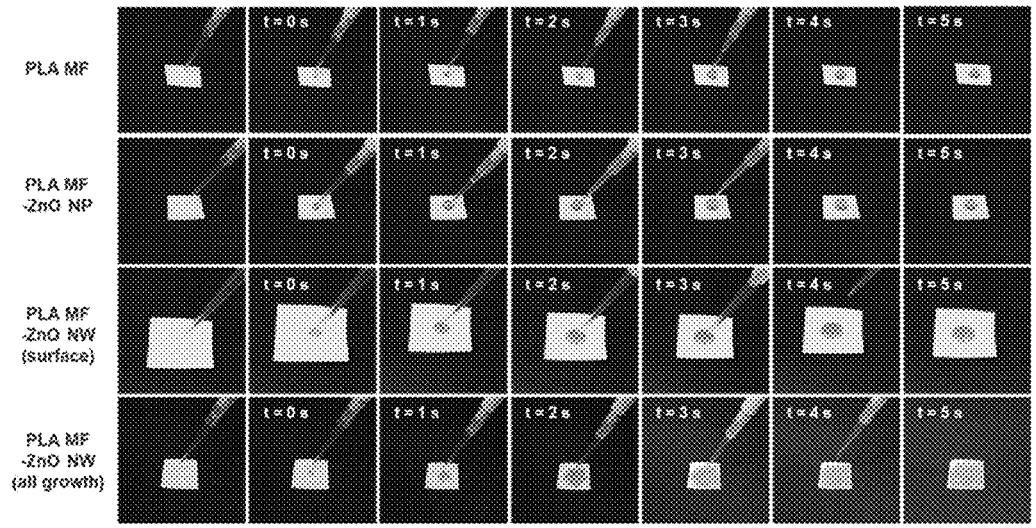
[FIG. 9]
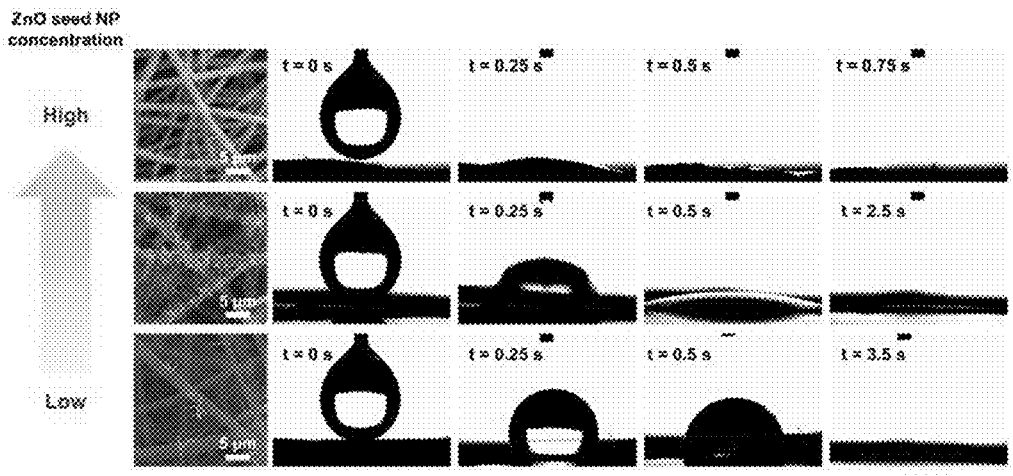

[FIG. 10]
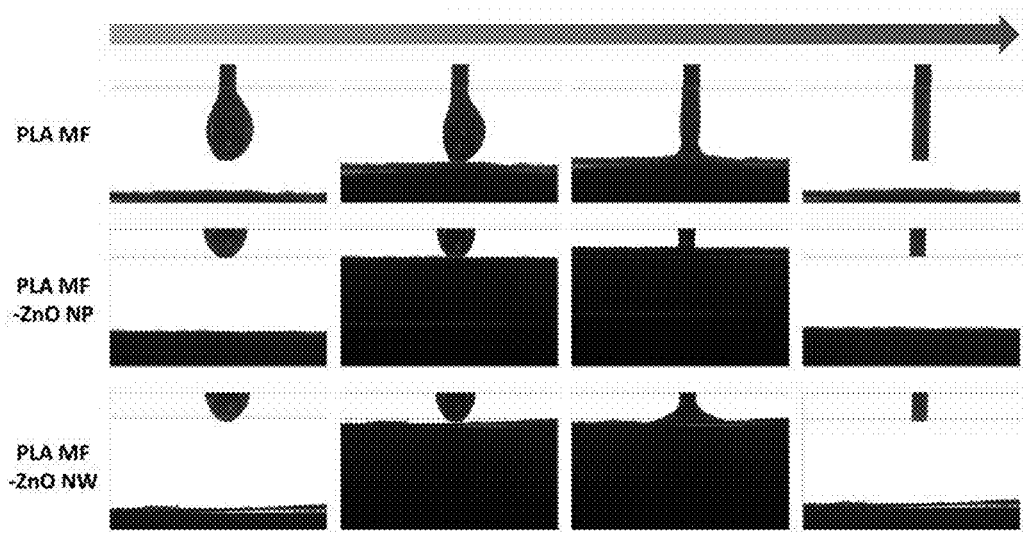
[FIG. 11]
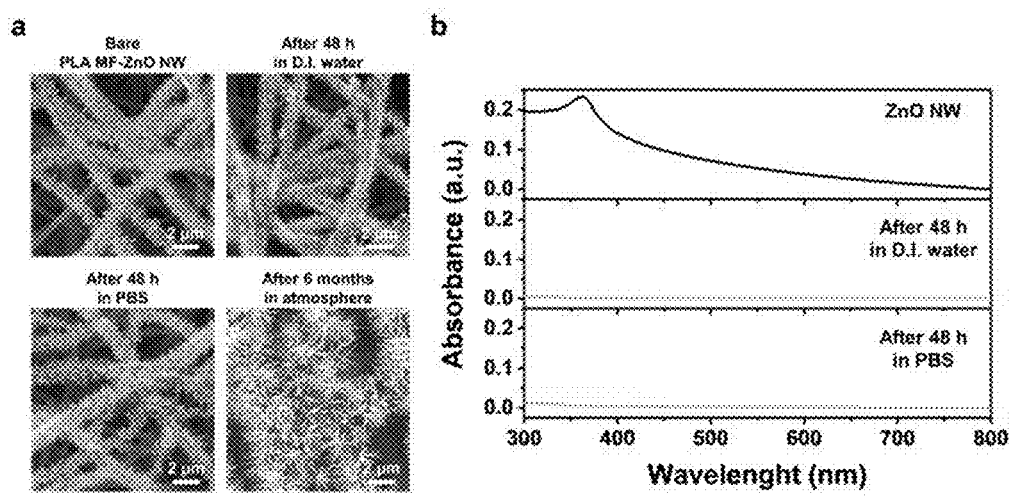

[FIG. 12]
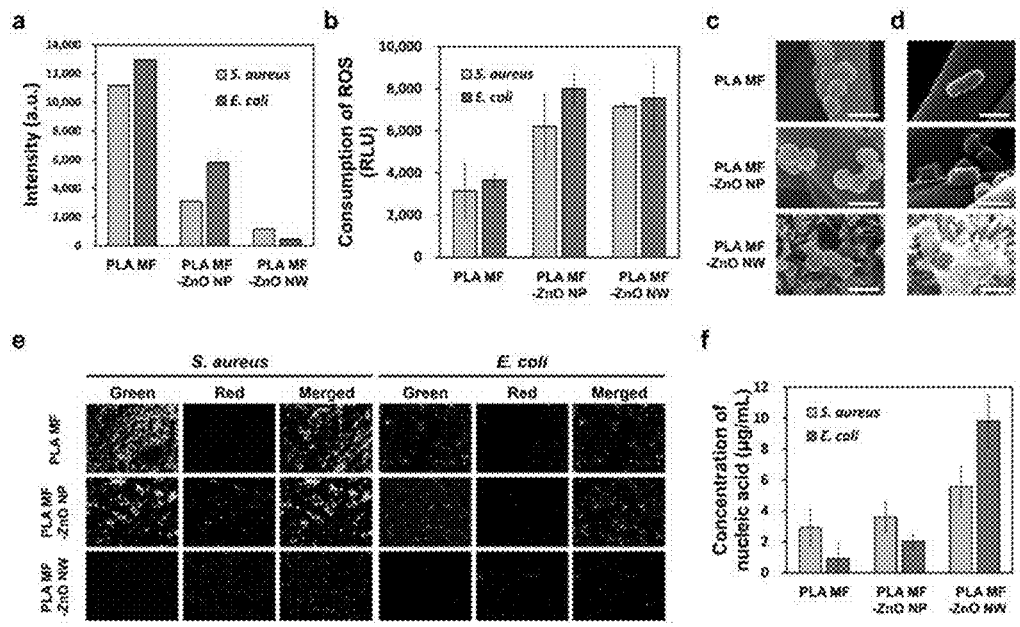
[FIG. 13]
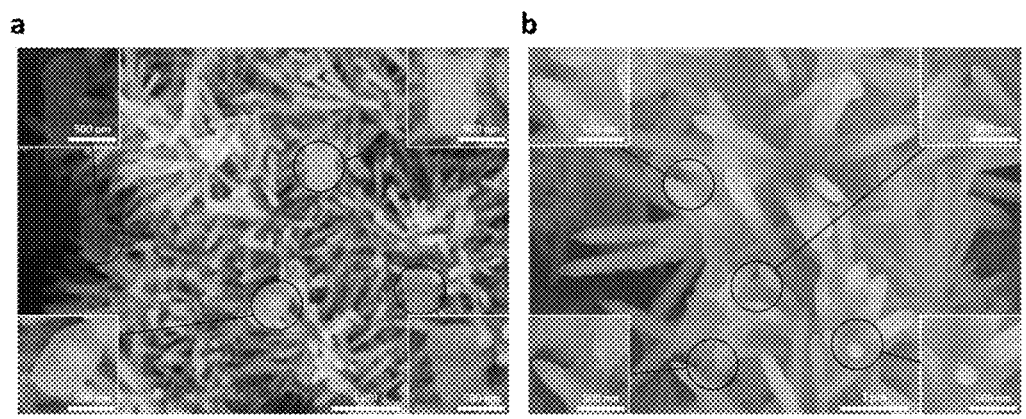

[FIG. 14]
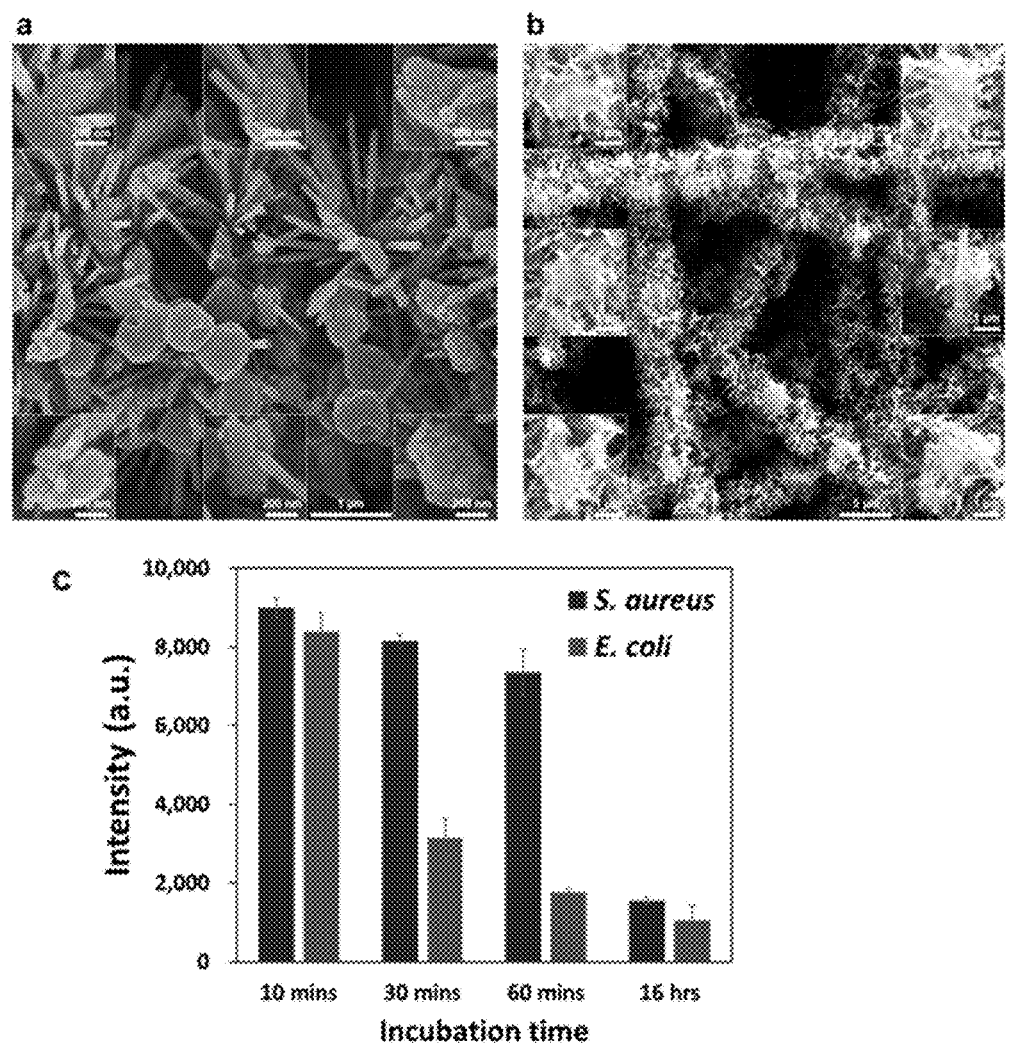

SUPER-AMPHIPHILIC FIBER-NANOWIRE COMPOSITE AND APPLICATION

BACKGROUND

1. Field of the Invention

The present invention relates to a super-amphiphilic fiber-nanowire composite and an application thereof.

2. Discussion of Related Art

Microfibers have a structure with a diameter of about 10 μm, have a low specific gravity and a very large surface area per volume, and have microcavities. Microfibers have unique physical and chemical properties, and due to having these properties, they have been used in various fields such as the wastewater treatment field, cosmetics field, drug delivery field, anticancer treatment field, and filter field. In particular, biocompatible microfibers are biocompatible materials and thus have been used in various fields such as the medical field (e.g., sutures, tissue regeneration, biosensors, drug delivery systems, and antibacterial materials) and the cosmetic field (e.g., mask).

As a method of manufacturing microfibers, an electrospinning method, a self-assembly method, a phase separation method, and the like have been used. In the self-assembly method, molecules are spontaneously organized without additional stimuli. However, the self-assembly method is sensitive to synthesis conditions and has a complicated synthesis process and a very low yield. In the phase separation method, fibers are synthesized by cooling a polymer solution for a short time. The phase separation method is simpler than the self-assembly method but has limitations on the type of polymer. On the other hand, the electrospinning method is simpler and has a higher yield than the other synthesis methods, and there is no limitation on the type of polymer.

Meanwhile, methods for growing inorganic nanoparticles into nanowires include a hydrothermal method. In the case of zinc oxide, synthesis is possible at a temperature of 60° C. to 100° C. or at a temperature of 400° C. or more, but since there are many limitations in synthesizing zinc oxide at a high temperature of 400° C. or more, the synthesis is usually carried out at a lower temperature of 60° C. to 100° C. At a temperature of 60° C. to 100° C., the mass production of nanowires on a variety of substrates is possible.

As a method for preparing a two-material composite, such as a form in which nanowires are bonded to microfibers, a conventional dip-coating method has been mainly used. In the dip-coating method, microfibers are dipped in a solution containing nanoparticles for a predetermined period of time to immobilize the particles on the surface of the fibers. However, since the nanoparticles are merely physically immobilized on the surface, an additional process is required, and there is a risk of causing an inconsistent distribution of nanoparticles.

Therefore, there is a need for a new method for preparing a two-material composite such as a form in which nanowires are bonded to microfibers.

SUMMARY OF THE INVENTION

The present invention is directed to providing a method of manufacturing a fiber-nanowire composite-based sheet.

Specifically, the present invention is directed to providing a method of manufacturing a fiber-nanowire composite-based sheet, which includes the steps of: electrospinning an electrospinning solution including metal nanoparticles or metal oxide nanoparticles and a polymer and thus preparing fibers in which the metal nanoparticles or the metal oxide nanoparticles are located inside and/or on the surface of the fibers; and growing metal nanowires or metal oxide nanowires from metal nanoparticles or metal oxide nanoparticles located inside and/or on the surface of the fibers, and thus preparing a fiber-nanowire composite.

In addition, the present invention is directed to providing a fiber-nanowire composite-based sheet manufactured by the above-described manufacturing method.

One aspect of the present invention provides a method of manufacturing a fiber-nanowire composite-based sheet, which includes the steps of: preparing a fiber-nanoparticle composite by electrospinning an electrospinning solution including metal nanoparticles or metal oxide nanoparticles and a polymer; adding the fiber-nanoparticle composite to a nanowire synthesis solution containing metal ions and then performing sonication; and growing metal nanowires or metal oxide nanowires from metal nanoparticles or metal oxide nanoparticles located inside and/or on the surface of the fiber-nanoparticle composite.

Another aspect of the present invention provides a fiber-nanowire composite-based sheet, which includes a fiber-nanowire composite including: fibers including a polymer; and metal nanowires or metal oxide nanowires grown from metal nanoparticles or metal oxide nanoparticles located inside and/or on the surface of the fibers, wherein the fiber-nanowire composite-based sheet has a water contact angle of 3° or less.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 1 is a schematic diagram illustrating a method of preparing a fiber-nanowire composite of the present invention;

FIG. 2 shows images confirming that zinc oxide nanoparticles (ZnO seed NP) are embedded in fibers of a fiber-nanoparticle composite prepared in Preparation Example 2, wherein, specifically, FIGS. 2A and 2B are a bright field TEM image and a dark field TEM image obtained by a transmission electron microscope (TEM), and FIGS. 2C and 2D are energy-dispersive X-ray spectroscopy (EDX) results;

FIG. 3 shows the scanning electron microscope (SEM) images of a fiber-nanowire composite prepared in Preparation Example 3;

FIG. 4 shows the results of measuring the movement of zinc oxide nanoparticles (ZnO seed NP) inside polylactic acid (PLA) fibers during a hydrothermal synthesis reaction of Preparation Example 3, wherein, specifically, FIG. 4A shows SEM images according to a reaction time, and FIGS. 4B and 4C are TEM images of cross-sections according to a reaction time and the schematic illustration thereof;

FIG. 5 shows the results of kinetically analyzing the growth of zinc oxide nanowires according to a reaction temperature in Preparation Example 3, wherein, specifically, FIG. 5A shows SEM images of a composite according to a reaction time and temperature, FIGS. 5B and 5C show the results of analyzing the length of zinc oxide nanowires according to a reaction time and temperature, and FIG. 5D shows the results of analyzing a zinc oxide nanowire growth rate according to a temperature based on the Arrhenius equation;

FIG. 6 shows SEM images of a fiber-nanowire composite prepared in Preparation Example 3 and a fiber-nanowire composite prepared in Comparative Preparation Example 3, wherein, specifically, FIG. 6A shows a fiber-nanowire composite prepared in Comparative Preparation Example 3 and FIG. 6B shows a fiber-nanowire composite prepared in Preparation Example 3;

FIG. 7A shows a schematic diagram showing a method of measuring a water contact angle of a fiber-nanowire composite prepared in Preparation Example 3, and FIG. 7B shows measurement results;

FIG. 8 shows the results of measuring the water penetrability of a fiber-nanowire composite prepared in Preparation Example 3 according to time;

FIG. 9 shows the results of comparing hydrophilic properties according to the density of zinc oxide nanowires (ZnO NW) present on the surface of fibers;

FIG. 10 shows the results of measuring a hexane (organic solvent) contact angle of a fiber-nanowire composite prepared in Preparation Example 3;

FIG. 11 shows the results of evaluating stability after treating a fiber-nanowire composite (PLA MF-ZnO NW) prepared in Preparation Example 3 with distilled water (D.I. water) and phosphate buffered saline (PBS) for 48 hours at 200 rpm and maintaining for six months in the air, wherein, specifically, FIG. 11A shows the results of measuring the shape of nanowires in the air and before and after shaking in an aqueous solution, and FIG. 11B shows the results of evaluating whether nanowires are separated from fibers by using a UV-Vis spectrometer;

FIG. 12 shows the results of evaluating the antimicrobial properties of a fiber-nanowire composite prepared in Preparation Example 3 against gram-negative *Escherichia coli* (*E. coli*) and gram-positive *Staphylococcus aureus* (*S. aureus*), wherein, specifically, FIG. 12A shows the results of evaluating the metabolic activity of *S. aureus* and *E. coli*, FIG. 12B shows the amount of reactive oxygen species (ROS) consumption used for killing *S. aureus* and *E. coli*, and FIGS. 12C and 12D show the results of evaluating the antibacterial effect of the fiber-nanowire composite against *S. aureus* and *E. coli*. In addition, FIG. 12E shows the fluorescence microscope images indicating surviving (stained green) or dead (stained red) *S. aureus* and *E. coli*, and FIG. 12F shows the results of measuring the concentration of nucleic acids discharged from *S. aureus* and *E. coli*;

FIG. 13 shows the results of evaluating the antibacterial effects of a fiber-nanowire composite prepared in Preparation Example 3 and a fiber-nanowire composite prepared in Comparative Preparation Example 3, wherein, specifically, FIG. 13A is an SEM image of a fiber-nanowire composite prepared in Comparative Preparation Example 3, and FIG. 13B is an SEM image of a fiber-nanowire composite prepared in Preparation Example 3; and FIG. 14 shows the results of evaluating the antibacterial effects of a fiber-nanowire composite against *S. aureus* and *E. coli* according to time, wherein, specifically, FIGS. 14A and 14B are SEM images showing antibacterial effects against *S. aureus* and *E. coli*, respectively, and FIG. 14C shows antibacterial effects against *S. aureus* and *E. coli* according to time.

DETAILED DESCRIPTION OF EXEMPLARY EMBODIMENTS

The present invention relates to a method of manufacturing a fiber-nanowire composite-based sheet, which includes the steps of: electrospinning an electrospinning solution including metal nanoparticles or metal oxide nanoparticles and a polymer and thus preparing a fiber-nanoparticle composite (hereinafter referred to as a fiber-nanoparticle composite preparation step); adding the fiber-nanoparticle composite to a nanowire synthesis solution containing metal ions and then performing sonication (hereinafter referred to as a sonication step); and growing metal nanowires or metal oxide nanowires from metal nanoparticles or metal oxide nanoparticles located inside and/or on the surface of the fiber-nanoparticle composite (hereinafter referred to as a fiber-nanowire composite preparation step).

Hereinafter, a fiber-nanowire composite-based sheet of the present invention will be described in more detail.

In the present invention, a fiber-nanowire composite-based sheet refers to a plate-shaped material in which a fiber-nanowire composite of the present invention is accumulated and arranged in a three-dimensional network structure.

In the present invention, the fiber-nanowire composite is a super-amphiphilic composite having both super-hydrophilic characteristics and super-lipophilic characteristics, and accordingly, the sheet can have both super-hydrophilic characteristics and super-lipophilic characteristics.

In the present invention, the fiber-nanoparticle composite preparation step is a step of preparing a fiber-nanoparticle composite by electrospinning an electrospinning solution. Through the electrospinning, a sheet based on a fiber-nanoparticle composite can be manufactured.

In the present invention, the electrospinning solution may be prepared by mixing a nanoparticle solution including metal nanoparticles or metal oxide nanoparticles and a bipolar solvent, and a polymer solution including a polymer and an organic solvent.

According to one embodiment, the metal or the metal oxide may include one or more selected from the group consisting of zinc oxide (ZnO), zirconium oxide ($ZrO_2$), aluminum oxide ($Al_2O_3$), manganese oxide ($MnO_2$), titanium oxide ($TiO_2$), copper oxide (CuO), tungsten oxide ($WO_3$), vanadium oxide ($V_2O_5$), iron oxide ($Fe_3O_4$), cobalt oxide ($Co_3O_4$), nickel oxide (NiO), nickel (Ni), copper (Cu), silver (Ag), and gold (Au).

According to one embodiment, the metal oxide nanoparticles may be prepared according to a manufacturing method commonly used in the art.

When the metal oxide is zinc oxide, zinc oxide nanoparticles may be prepared through the steps of: dissolving a zinc oxide precursor in a solvent to prepare a zinc oxide precursor solution; adding a cationic surfactant to the zinc oxide precursor solution and heating at a temperature of 40° C. to 60° C.; heating a sodium hydroxide solution to a temperature of 40° C. to 60° C.; mixing the sodium hydroxide solution and the zinc oxide precursor solution, to which the cationic surfactant is added, and reacting the same at a temperature of 40° C. to 60° C., and thus precipitating nanoparticles; and washing and drying the precipitated nanoparticles and thus obtaining zinc oxide nanoparticles.

In this case, the zinc oxide precursor may be hexadecyltrimethylammonium bromide (($C_{16}H_{33}$)N($CH_3$)3Br), the solvent for the precursor solution may be ethanol, methanol, dimethylmethanamide (DMF), tetrahydrofuran (THF), or a combination thereof, and the sodium hydroxide solution may be prepared by dissolving sodium hydroxide (NaOH) in the solvent for the precursor solution.

In the present invention, the metal nanoparticles or the metal oxide nanoparticles may be grown into nanowires in a fiber-nanowire composite preparation step to be described below.

The metal nanoparticles or the metal oxide nanoparticles may be present in a state in which nanoparticles having a size of 2 to 10 nm are aggregated, and the average particle diameter of the metal nanoparticles or the metal oxide nanoparticles is not particularly limited, and may be in the range of 2 to 200 nm, 40 to 100 nm, or 50 to 90 nm. Within the above-described average particle diameter range, the metal nanoparticles or the metal oxide nanoparticles can be located inside and/or on the surface of fibers and can be grown into metal nanowires or metal oxide nanowires.

The content of the metal nanoparticles or the metal oxide nanoparticles may be in the range of 1 mg/mL to 15 mg/mL.

According to one embodiment, the metal nanoparticles or the metal oxide nanoparticles can be uniformly dispersed in a bipolar solvent, and therefore, the nanoparticles can be uniformly dispersed in the electrospinning solution. The bipolar solvent may be ethanol, methanol, DMF, THF, or a combination thereof.

According to one embodiment, for the uniform dispersion of the metal nanoparticles or the metal oxide nanoparticles in the bipolar solvent, an instrument such as a vortex mixer, a shaker, or an ultrasonic cleaner may be used so that the nanoparticles are more uniformly dispersed.

According to one embodiment, the polymer may be formed into fibers through electrospinning. The polymer may be a biocompatible polymer, and since a biocompatible polymer is used, the fibers are biocompatible and can be degraded over time in vivo.

The type of this polymer is not particularly limited, and specifically, the polymer may include one or more selected from the group consisting of polylactic acid (PLA), polyglycolic acid (PGA), polycaprolactone (PCL), poly(lactic-co-glycolic acid) (PLGA), polyhydroxybutyrate (PHB), polyurethane (PU), polyacrylonitrile (PAN), polyvinyl alcohol (PVA), polyethylene oxide (PEO), polyaniline (PANI), polystyrene (PS), polymethyl methacrylate (PMMA), polyvinylidene fluoride (PVDF), and polycarbonate (PC).

The content of the polymer may be 13 to 27 (w/v)% relative to the organic solvent.

In addition, the type of the organic solvent is not particularly limited, and chloroform ($CHCl_3$) may be used.

According to one embodiment, a mixing ratio (weight ratio) of the nanoparticle solution and the polymer solution may be 20 to 30:70 to 80.

According to one embodiment, when preparing the electrospinning solution, an instrument such as a vortex mixer, a shaker, or an ultrasonic cleaner may be used so that the metal nanoparticles or the metal oxide nanoparticles are more uniformly dispersed in the electrospinning solution.

In the present invention, a fiber-nanoparticle composite-based sheet may be prepared by electrospinning the electrospinning solution. In the composite prepared by electrospinning, the metal nanoparticles or the metal oxide nanoparticles may be located inside and/or on the surface of the fibers. That is, the metal nanoparticles or the metal oxide nanoparticles may be located inside of the fibers or may be present in a state in which a part thereof protrudes from the surface of the fibers, or the metal nanoparticles or the metal oxide nanoparticles may be located both inside and on the surface of the fibers.

Electrospinning refers to a method of producing filamentous fibers having a diameter scale of several nanometers (nm) to several micrometers (pm) by spraying a dissolved polymer solution in an electric field. That is, the sheet of the present invention has a form in which the fibers are entangled.

In the present invention, since the electrospinning solution includes the polymer and the metal nanoparticles or the metal oxide nanoparticles, the metal nanoparticles or the metal oxide nanoparticles may be located inside and/or on the surface of the fibers in the prepared composite.

According to one embodiment, a fiber diameter may vary depending on the diameter of the metal nanoparticles or the metal oxide nanoparticles and electrospinning conditions such as the size of a spinning needle, and for example, the diameter of fibers may be in the range of 50 to 5,000 nm, 100 to 2,000 nm, or 100 to 1,300 nm. In this case, the fiber diameter means a fiber length measured in a direction perpendicular to a direction in which the fibers are spun during electro spinning According to one embodiment, the electrospinning may be performed using electrospinning equipment commonly used in the art.

According to one embodiment, the electrospinning equipment may include a high voltage supply device, a syringe pump through which a solution is spun, and a collector on which fibers are collected. When a high voltage is applied to a tip of the syringe pump, fibers may be spun using the surface tension of a solution and electrostatic repulsion and synthesized on the collector while undergoing the evaporation of the organic solvent and the bipolar solvent.

According to one embodiment, during the electrospinning, an electrospinning solution flow rate of the syringe pump may be set at 1 mL/hr, and a voltage may be set at a direct current voltage of 10 kV. A spinning needle may be a 21-gauge nickel alloy needle, and a distance between the collector and the spinning needle may be 10 cm.

According to one embodiment, after the electrospinning, the prepared fiber-nanoparticle composite may be dried in an atmospheric atmosphere for 20 to 30 hours or 20 to 25 hours at a temperature of 20 to 30° C. or room temperature.

In the present invention, a sonication step is a step of adding the above-described fiber-nanoparticle composite to a nanowire synthesis solution containing metal ions and then performing sonication. The fiber-nanoparticle composite produced by the electrospinning has hydrophobic characteristics, but when the composite is subjected to sonication and then nanowires are grown, the finally prepared fiber-nanowire composite may have super-amphiphilic characteristics.

According to one embodiment, the metal ions may include zinc ions ($Zn^{2+}$), zirconium ions ($Zr^{2+}$), aluminum ions ($Al^{3+}$), manganese ions ($Mn^{2+}$), titanium ions ($Ti^{2+}$), copper ions ($Cu^{2+}$), tungsten ions ($W^{6+}$), vanadium ions ($V^{4+}$), iron ions ($Fe^{2+}$, $Fe^{3+}$), cobalt ions ($Co^{2+}$, $Co^{3+}$), nickel ions ($Ni^{2+}$), silver ions (AO, and gold ions ($Au^+$). The metal ions may be supplied by a metal precursor or a metal oxide precursor.

According to one embodiment, the nanowire synthesis solution may include a metal precursor or a metal oxide precursor, polyethylenimine (PEI; $H(NHCH_2CH_2)nNH_2$), and ammonium chloride ($NH_4Cl$).

According to one embodiment, the metal of the metal precursor or the metal oxide of the metal oxide precursor may be the same as the metal or the metal oxide used in the fiber-nanoparticle composite preparation step, and may be, specifically, zinc oxide.

According to one embodiment, the zinc oxide precursor is not particularly limited as long as it is a compound capable of supplying zinc ions, and may be zinc nitrate hexahydrate ($Zn(NO_3)_2+6H_2O$).

The concentration of the metal precursor or the metal oxide precursor may be in the range of 5 to 20 mM or 10 mM.

According to one embodiment, the PEI and the ammonium chloride (NH₄Cl) may be used for vertically growing metal nanowires or metal oxide nanowires.

According to one embodiment, after adding the fiber-nanoparticle composite to the nanowire synthesis solution, sonication may be performed.

According to one embodiment, the sonication may be performed using a sonicator. The sonication may help the nanowire synthesis solution to be absorbed into the entire fiber included in the sheet so that nanowires can be uniformly grown on the entire fiber included in the sheet. The raw fibers produced by electrospinning have hydrophobic characteristics. Therefore, when the nanowire synthesis solution used for the growth of nanowires is absorbed into the entire fiber, the growth of nanowires can be facilitated. When the sonication step is not performed, there is a risk that nanowires only grow on the fiber surface and not inside the fiber. In addition, there is a risk that the nanowires only grow in the surface portion of the sheet and not on the fibers inside the sheet.

According to one embodiment, the sonication may be performed at an intensity of 1 to 100 kHz, 10 to 50 kHz, or 20 kHz to 40 kHz, for 1 to 600 seconds, 1 to 100 seconds, 2 to 50 seconds, or 3 to 30 seconds.

In the present invention, a fiber-nanowire composite preparation step is a step of growing metal nanowires or metal oxide nanowires from the metal nanoparticles or metal oxide nanoparticles on the inside and/or surface of the fiber. In this step, the nanowires may be grown through hydrothermal synthesis.

In this step, the metal nanoparticles or metal oxide nanoparticles located inside and/or on the surface of the fiber may grow into nanowires. The growth of nanowires through hydrothermal synthesis does not require processes other than hydrothermal synthesis, and it is possible to produce more uniform nanowires compared to the conventional dip-coating method by overcoming the instability and non-uniform dispersion of nanoparticles.

According to one embodiment, a hydrothermal synthesis temperature may be in the range of 30 to 99° C., 60 to 95° C., or 65 to 95° C. In addition, a synthesis time may be in the range of 1 minute to 1,200 minutes, 1 minute to 300 minutes, 1 minute to 200 minutes, or 5 minutes to 150 minutes. In the present invention, the synthesis temperature and the synthesis time may be optimized so that fiber strength is maintained and nanowires can be grown uniformly on fibers throughout the sheet.

According to one embodiment, a plurality of metal nanowires or metal oxide nanowires may be formed on one metal particle or metal oxide nanoparticle. A plurality of nanowires may be referred to as a nanowire bundle. The plurality of nanowires may have a radial structure, that is, a nanowire bundle structure in which the nanowires are inclined from a normal direction of a plane toward the plane.

The length of one metal nanowire or metal oxide nanowire may be in the range of 50 to 7,000 nm, 100 to 5,000 nm, 500 to 3,000 nm, or 800 nm to 2,500 nm, and a diameter may be in the range of 10 to 500 nm, 50 to 300 nm, or 100 nm to 150 nm. Here, the length means a length measured from the center of nanoparticles along the growth direction of the nanowires, and the diameter means a length measured in a direction perpendicular to the growth direction. In addition, the cross-sectional shape of the metal nanowires or metal oxide nanowires, specifically, the shape of a cross-section cut along a direction perpendicular to the growth direction, is not particularly limited, and may be circular or polygonal, specifically, hexagonal.

In the present invention, the synthesis conditions of the fiber-nanowire composite are specified, so the surface characteristics and durability of fiber can be controlled so that the fiber-nanowire composite can have optimal properties. In addition, since fibers are produced in the form of a sheet through electrospinning, a fiber-nanowire composite-based sheet can be manufactured.

According to one embodiment, the fiber-nanowire composite and a sheet based thereon may have super-amphiphilicity. Super-amphiphilicity means to have the superhydrophobic (non-polar) characteristics and superhydrophilic (polar) characteristics at the same time.

In addition, the present invention relates to a fiber-nanowire composite-based sheet manufactured by the above-described method of manufacturing a fiber-nanowire composite-based sheet.

A fiber-nanowire composite-based sheet of the present invention includes a fiber-nanowire composite including: fibers including a polymer; and metal nanowires or metal oxide nanowires grown from metal nanoparticles or metal oxide nanoparticles on the inside and/or surface of the fibers.

According to one embodiment, the fiber-nanowire composite may be prepared through the steps of: preparing a fiber-nanoparticle composite by electrospinning an electrospinning solution including metal nanoparticles or metal oxide nanoparticles and a polymer; adding the fiber-nanoparticle composite to a nanowire synthesis solution containing metal ions and then performing sonication; and growing metal nanowires or metal oxide nanowires from metal nanoparticles or metal oxide nanoparticles on the inside and/or the surface of the fiber-nanoparticle composite.

The method of manufacturing a fiber-nanowire composite is the same as described above in the method of manufacturing a fiber-nanowire composite-based sheet.

According to one embodiment, the water (aqueous solvent) contact angle of the sheet may be 3° or less or 2.5° or less. The lower limit of the contact angle may be more than 0.1°. Through this, it can be confirmed that the sheet has superhydrophilic characteristics.

In addition, according to one embodiment, a hexane (organic solvent) contact angle of the sheet may be 3° or less, 2° or less, or 1° or less, and may be close to 0°. Through this, it can be confirmed that the sheet has superlipophilic characteristics.

This contact angle may be measured immediately after dropping water or hexane on the sheet, specifically within five seconds.

According to one embodiment, a wetting time of the sheet in water may be 0 to 1 minute, 1 to 40 seconds, or 1 to 30 seconds. The wetting time refers to a time it takes for 80% or more of the sheet to absorb water.

According to one embodiment, the thickness of the sheet may be 1,000 mm or more, 2,000 nm or more, or 5,000 nm or more. The upper limit of the sheet thickness may be 1,000 μm. Within this thickness range, the sheet has appropriate strength and super-amphiphilic characteristics, and is advantageous for application as an antibacterial filter, an antibacterial film, or the like.

In the present invention, the sheet may have an antibacterial effect against gram-negative bacteria and gram-positive bacteria. The gram-negative bacteria may be *Escherichia coli* (*E. coli*), *Salmonella*, *Pseudomonas aeruginosa*, or *Yersinia pestis*, and the gram-positive bacteria may be

*Staphylococcus aureus* (*S. aureus*), *Bacillus anthracis*, or *Corynebacterium diphtheriae*.

The metal or metal oxide, specifically, zinc oxide itself, may have antibacterial activity against various bacteria by generating ROS. In addition, the nanowires formed on the fiber not only generate ROS more effectively, but also can kill bacteria by effectively penetrating the cell membrane of the bacteria due to the hydrophilic characteristics and structural characteristics of the nanowires.

According to one embodiment, since the sheet of the present invention has superhydrophilic characteristics and can be penetrated by water, the gram-negative bacteria such as *E. coli* can come into contact with metal nanowires or metal oxide nanowires throughout the sheet, so an excellent antibacterial effect is exhibited, and a phenomenon in which the bacteria are killed may occur. In addition, since the fiber-nanowire composite of the present invention has a structure in which nanowires protrude, an antibacterial effect in which the gram-positive bacteria such as *S. aureus* is penetrated by the nanowires and killed may be exhibited. In addition, since the sheet has superhydrophilic characteristics, the sheet is rapidly penetrated by a solution containing *S. aureus*, and as the force exerted by the solution penetrating the sheet greatly physically damages *S. aureus*, *S. aureus* may be rapidly killed.

In the present invention, the sheet may be applied as an antibacterial filter, an antibacterial film, an antiviral filter, an antiviral film, an antifouling coating, a drug delivery vehicle, or a water treatment filter.

Advantages and features of the present invention, and a method for achieving the same, will become apparent with reference to the exemplary embodiments described below in detail. However, the present invention is not limited to the exemplary embodiments disclosed below and may be implemented in various different forms, and the exemplary embodiments are provided so that the disclosure of the present invention is complete and the scope of the invention is fully disclosed to those of ordinary skill in the art to which the present invention pertains, and the present invention is only defined by the scope of the claims.

EXAMPLES

FIG. 1 is a schematic diagram illustrating a method of preparing a fiber-nanowire composite of the present invention.

In the present invention, a polymer solution is prepared by dissolving a polymer in an organic solvent, a nanoparticle solution is prepared by dispersing metal nanoparticles or metal oxide nanoparticles in a bipolar solvent, and then an electrospinning solution is prepared by mixing the polymer solution and the nanoparticle solution. Subsequently, a fiber-nanoparticle composite is prepared from the electrospinning solution using electrospinning equipment.

Subsequently, the fiber-nanoparticle composite is added to a nanowire synthesis solution, and hydrothermal synthesis is performed to grow nanowires from the nanoparticles. Through this, a fiber-nanowire composite is prepared. The fiber-nanowire composite obtained by electrospinning has a form in which the fibers are entangled, and thus has a sheet form.

Preparation Example 1. Synthesis of zinc oxide nanoparticles

Zinc oxide nanoparticles were synthesized.

First, 50 mM zinc nitrate hexahydrate ($Zn(NO_3)_2 + 6H_2O$), which is a zinc oxide precursor, and 12 mM hexadecyltrimethylammonium bromide (CTAB; $(C_{16}H_{33})N(CH_3)_3Br$), which is a cationic surfactant, were added to ethanol through an injection part of a 100 ml flask and dissolved, and heated for one to two hours at a temperature of 40° C. to 60° C. In another 100 mL flask, 100 mM sodium hydroxide was added to ethanol and dissolved using an ultrasonic cleaner, and heated to a temperature of 50° C. to 60° C. When the sodium hydroxide was dissolved, the resultant was added to the flask in which zinc oxide precursor was dissolved, and reacted for one to two hours at a temperature of 50° C. to 60° C. Subsequently, four to five washes with ethanol, which is a washing agent, and drying were performed, and thus zinc oxide nanoparticles were obtained.

Preparation Example 2. Synthesis of fiber-nanoparticle composite

To prepare an electrospinning synthesis solution, a polymer solution was prepared by adding 150 mg of poly(L-lactide) (PLA) to 0.75 mL of chloroform, which is an organic solvent, and dissolving the same. 3.75 mg, 1.25 mg, or 0.25 mg of the zinc oxide nanoparticles prepared in Preparation Example 1 were dispersed in 0.25 mL of ethanol, which is a bipolar solvent and stirred, and thus a nanoparticle solution was obtained. An electrospinning solution was prepared by mixing the polymer solution and the nanoparticle solution and performing stirring.

A high voltage was applied to a syringe tip fixed to a syringe pump to synthesize fibers.

During electrospinning, an electrospinning synthesis solution discharge rate of the syringe pump was set at 1 mL/hr, and a voltage was set at a direct current voltage of 9 kV. A 21-gauge nickel alloy syringe needle was used. A distance between a collector and the needle was set at 13 cm. The fibers were spun due to an interaction between the surface tension of the electrospinning solution and electrostatic repulsion due to the applied voltage, and synthesized in the form of a sheet on the collector.

After the electrospinning, the prepared fiber-nanoparticle composite was dried in an atmospheric atmosphere for 24 hours at room temperature, and thereby the preparation of a fiber-nanoparticle composite was completed.

Comparative Preparation Example 2. Synthesis of PLA fiber

PLA fibers were synthesized in the same manner as in Preparation Example 2 except that pure ethanol without nanoparticles was used instead of the ethanol, in which nanoparticles were dispersed, used in Preparation Example 2.

Specifically, to prepare an electrospinning synthesis solution, 150 mg of PLA, which is a polymer for fiber synthesis, was added to 0.75 mL of chloroform and dissolved. The dissolved polymer solution was mixed with 0.25 mL of ethanol to prepare an electrospinning synthesis solution. Subsequent electrospinning processes are the same as in Preparation Example 2.

Preparation Example 3. Synthesis of Fiber-Nanowire Composite

The fiber-nanoparticle composite prepared in Preparation Example 2 was subjected to a hydrothermal synthesis method to grow nanowires from the zinc oxide nanoparticles.

The fiber-nanoparticle composite prepared in Preparation Example 2 was added to a nanowire synthesis solution including 10 mM zinc nitrate hexahydrate ($Zn(NO_3)_2 + 6H_2O$), which is a zinc oxide precursor, and 10 mM hexamethylenetetramine (HMTA; $C_6H_{12}N_4$). In this case, the nanowire synthesis solution includes 60 mM ammonium chloride ($NH_4Cl_2$) and 2 mM polyethylenimine (PEI; $H(NHCH_2CH_2)_nNH_2$).

The nanowire synthesis solution to which the fiber-nanoparticle composite had been added was subjected to sonication. The sonication was performed at an intensity of 20 kHz to 40 kHz for five seconds.

Subsequently, a hydrothermal synthesis reaction was performed for one to two hours at a temperature of 65 to 95° C. to grow zinc oxide nanowires.

Through this, a fiber-nanowire composite was finally prepared.

Comparative Preparation Example 3. Synthesis of Fiber-Nanowire Composite

A fiber-nanowire composite was prepared in the same manner as in Preparation Example 3 except that sonication was not performed before a hydrothermal synthesis reaction.

Experimental Example 1. Physical Properties of Fiber-Nanoparticle Composite and Fiber-Nanowire Composite FIG. 2 shows images showing zinc oxide nanoparticles (ZnO seed NP) embedded in fibers of a fiber-nanoparticle composite prepared in Preparation Example 2.

The above FIGS. 2A and 2B are a bright field TEM image and a dark field TEM image obtained by a TEM, and FIGS. 2C and 2D are EDX results.

Referring to FIG. 2, it can be seen that the zinc oxide nanoparticles are evenly embedded in fibers.

FIG. 3 shows the scanning electron microscope (SEM) images of a fiber-nanowire composite prepared in Preparation Example 3.

Referring to FIG. 3, it can be confirmed that zinc oxide nanowires are evenly and radially formed throughout fibers.

FIG. 4A is an SEM image according to a hydrothermal synthesis reaction time, and it can be confirmed that zinc oxide nanowires gradually grow on PLA fibers with the elapse of hydrothermal synthesis reaction time.

In addition, FIGS. 4B and 4C are TEM images of cross-sections according to a reaction time and the schematic illustration thereof, and it can be confirmed that zinc oxide nanoparticles, which were initially (0 min) uniformly dispersed in fibers, migrate to the outer surface of the fiber with the elapse of reaction time and grow into zinc oxide nanowires.

FIG. 5 shows the results of kinetically analyzing the growth of zinc oxide nanowires according to a hydrothermal synthesis reaction temperature in Preparation Example 3.

FIG. 5A shows SEM images of a composite according to a hydrothermal synthesis reaction time and temperature, and as a result of analyzing the growth of zinc oxide nanowires, it can be seen that as a temperature increases, the zinc oxide nanowire rapidly grows at an initial stage of the reaction.

FIGS. 5B and 5C show the results of analyzing the length of zinc oxide nanowires according to a hydrothermal synthesis reaction time and temperature, it can be seen that when the same zinc precursor solution is used, at a high hydrothermal synthesis reaction temperature, nanowires grow quickly but the zinc precursor is quickly consumed due to homogeneous nucleation that additionally occurs. On the other hand, it can be seen that at a low temperature, nanowires grow slowly but the zinc precursor is used only for the growth of the nanowires because a homogeneous nucleation reaction does not occur. Based on a temperature of 80° C., only heterogeneous nucleation occurs at a temperature less than 80° C., and both heterogeneous nucleation and homogeneous nucleation occur at a temperature of 80° C. or higher.

In addition, FIG. 5D shows the results of analyzing a zinc oxide nanowire growth rate according to a hydrothermal reaction temperature based on the Arrhenius equation. The activation energy for zinc oxide nanowire formation was 20.57 kJ/mol, which indicates that the type of nucleation was heterogeneous nucleation. This shows that zinc oxide nanowires have grown from zinc oxide nanoparticles.

FIG. 6 shows SEM images of a fiber-nanowire composite prepared in Preparation Example 3 and a fiber-nanowire composite prepared in Comparative Preparation Example 3.

FIG. 6A shows a fiber-nanowire composite prepared in Comparative Preparation Example 3, and it can be seen that after a hydrothermal synthesis reaction (right image), nanowires have grown only on the outermost fibers on the surface of a sheet. This is because fibers themselves have hydrophobic characteristics, so fibers in an inner part of a sheet have not reacted. On the other hand, in the case of the fiber-nanowire composite prepared in Preparation Example 3 of the present invention, it can be seen that since hydrothermal synthesis was performed after sonication, nanowires have also grown on fibers in an inner part of a sheet.

FIG. 7A shows a schematic diagram showing a method of measuring a water contact angle of a fiber-nanowire composite prepared in Preparation Example 3, and FIG. 7B shows measurement results.

Specifically, the contact angles of the fiber-nanowire composite (PLA MF-ZnO NW (all growth)) prepared in Preparation Example 3, the fiber (PLA MF) prepared in Comparative Preparation Example 2, the fiber-zinc oxide nanoparticle composite (PLA MF-ZnO NP) prepared in Preparation Example 2, and the composite (PLA MF-ZnO NW (surface)) including zinc oxide nanowires only on fiber surfaces prepared in Comparative Preparation Example 3 were measured.

The contact angle was measured by placing a liquid droplet on a sample to be measured and measuring an angle between the surface of the sample and the liquid droplet.

As a result, the contact angles were 129.9±8.2° (PLA MF), 129.4±5.8° (PLA MF-ZnO NP), and 125.2±3.7° (PLA MF-ZnO NW(surface)), which indicate hydrophobicity. On the other hand, as nanowires have grown on all fibers, the fiber-nanowire composite (PLA MF-ZnO NW (all growth)) of the present invention had a smaller contact angle of 2.0±0.4°, which indicates superhydrophilicity.

FIG. 8 shows the results of measuring the water penetrability of a fiber-nanowire composite prepared in Preparation Example 3 according to time.

Structural characteristics due to the formation of nanowires on fiber surfaces affect water penetrability. In the case of the fiber (PLA MF) prepared in Comparative Preparation Example 2, the fiber-zinc oxide nanoparticle composite (PLA MF-ZnO NP) prepared in Preparation Example 2, and the composite (PLA MF-ZnO NW(surface)) including zinc oxide nanowires only on fiber surfaces prepared in Comparative Preparation Example 3, which had hydrophobic characteristics, water was not absorbed into fibers even after five seconds have elapsed since a water droplet was dropped. On the other hand, in the case of the fiber-nanowire composite (PLA MF-ZnO NW (all growth)) of the present invention having superhydrophilic characteristics, it can be seen that water penetrated the sheet immediately after or within a few seconds of dropping it on the sheet.

FIG. 9 shows the results of comparing hydrophilic properties according to the density of zinc oxide nanowires (ZnO NW) present on the surface of fibers.

Referring to FIG. 9, it can be seen that as the concentration of zinc oxide nanoparticles (ZnO seed NP) increases, the density of nanowires increases, and the higher the density of the nanowires, the faster the water penetrates. That is, by controlling the concentration of zinc oxide nanoparticles, it is possible to control the hydrophilic characteristics of the prepared composite.

FIG. 10 shows the results of measuring a hexane (organic solvent) contact angle of a fiber-nanowire composite prepared in Preparation Example 3.

Referring to FIG. 10, it can be seen that the contact angles of all of the fiber (PLA MF) prepared in Comparative Preparation Example 2, the fiber-nanoparticle composite (PLA MF-ZnO NP) prepared in Preparation Example 2, and the fiber-nanowire composite (PLA MF-ZnO NW) prepared in Preparation Example 3 were close to 0°. That is, it can be seen that the fiber-nanowire composite of the present invention is a super-amphiphilic composite having both superhydrophilic characteristics and superlipophilic characteristics.

In addition, FIG. 11 shows the results of evaluating stability after treating a fiber-nanowire composite (PLA MF-ZnO NW) prepared in Preparation Example 3 with D.I. water and PBS for 48 hours at 200 rpm and maintaining for six months in the air.

FIG. 11A shows the results of measuring the shape of nanowires in the air and before and after shaking in an aqueous solution, and from the fact that there is no shape change such as the separation of nanowires from fibers or the breakage of nanowires, it can be seen that the composite has high stability.

FIG. 11B shows the results of evaluating whether nanowires are separated from fibers by using a UV-Vis spectrometer, and from the fact that the absorbance of nanowires was not observed in an aqueous solution in which the shaking was performed, it can be seen that the composite has high stability.

Experimental Example 2. Evaluation of Antibacterial Performance of Fiber-Nanowire Composite To confirm the antibacterial performance of the fiber-nanowire composite prepared in Preparation Example 3, changes in the metabolic activity of model bacteria, S. aureus and E. coli, were observed.

Approximately $10^7$ of each of S. aureus and E. coli were added to the fiber-nanowire composite (PLA MF-ZnO NW) prepared in Preparation Example 3, the PLA fiber (PLA MF) prepared in Comparative Preparation Example 2, and the PLA fiber-nanoparticle composite (PLA MF-ZnO NP) prepared in Preparation Example 2, and maintained at 25° C. After 16 hours, the S. aureus and the E. coli were removed, and the metabolic activity of S. aureus and E. coli present on the surface of each sample was evaluated using Alamar blue assay.

Specifically, after adding resazurin to each sample containing residual S. aureus or E. coli and performing incubation for four hours, metabolic activity was evaluated based on the amount of resorufin production.

FIG. 12A shows the results of evaluating the metabolic activity of S. aureus and E. coli.

Referring to FIG. 12A, it can be seen that in the fiber-nanowire composite (PLA MF-ZnO NW), both S. aureus and E. coli had very low metabolic activity due to the death of bacteria. Through this, the antibacterial performance of the fiber-nanowire composite can be confirmed.

Experimental Example 3. Identification of Principle of Antibacterial Action of Fiber-Nanowire Composite (1)

To identify the principle of the antibacterial action of the fiber-nanowire composite prepared in Preparation Example 3, the amount of consumed ROS was measured.

S. aureus and E. coli were added to each sample in the same manner as in Experimental Example 2 and incubated for 16 hours. After 16 hours, S. aureus and E. coli were removed, and an ROS-Glo detection solution was added to determine the amount of consumed ROS.

FIG. 12B shows the amount of ROS consumption used for killing S. aureus and E. coli.

Referring to FIG. 12B, it can be seen that more ROS was consumed in the fiber-nanowire composite and the fiber-nanoparticle composite than in the fiber.

Through this, it can be seen that S. aureus and E. coli were damaged by the ROS generated by zinc oxide.

Experimental Example 4. Identification of Principle of Antibacterial Action of Fiber-Nanowire Composite (2)

To identify the principle of the antibacterial action of the fiber-nanowire composite prepared in Preparation Example 3, SEM images were obtained.

S. aureus and E. coli were added to each sample in the same manner as in Experimental Example 2 and incubated for 16 hours. After removing S. aureus and E. coli, the shape of S. aureus and E. coli on the surface of each sample was examined with an SEM.

FIGS. 12C and 12D show the results of evaluating the antibacterial effect of the fiber-nanowire composite against S. aureus and E. coli.

Referring to FIGS. 12C and 12D, it can be seen that the S. aureus and E. coli present in the fiber and the fiber-nanoparticle composite maintained their shape, whereas the S. aureus and E. coli present in the fiber-nanowire composite had a distorted shape or were perforated. Through this, the death of bacteria can be confirmed in the fiber-nanowire composite of the present invention unlike in the other comparative groups.

Experimental Example 5. Identification of Principle of Antibacterial Action of Fiber-Nanowire Composite (3)

To identify the principle of the antibacterial action of the PLA fiber-nanowire composite prepared in Preparation Example 3, fluorescence microscope images were observed, and the amount of discharged nucleic acid was measured.

S. *aureus* and *E. coli* were added to each sample in the same manner as in Experimental Example 2 and incubated for 16 hours. After removing *S. aureus* and *E. coli*, each sample was stained with SYTO™ 9 and propidium iodide and examined with a fluorescence microscope.

FIG. 12E shows the fluorescence microscope images indicating surviving (stained green) or dead (stained red) *S. aureus* and *E. coli*.

Referring to FIG. 12E, it can be seen that the green signal indicating living bacteria was reduced in the fiber-nanoparticle composite and the fiber-nanowire composite compared to the fiber (PLA MF). On the other hand, the red signal indicating dead bacteria was hardly observed in the fiber-nanowire composite. Through this, it can be seen that the cell death of both *S. aureus* and *E. coli* greatly increased in the fiber-nanowire composite.

Meanwhile, to confirm a decrease in the red signal, the amount of discharged nucleic acid was measured. The amount of discharged nucleic acid was determined by measuring absorbance at 260 nm.

FIG. 12F shows the results of measuring the concentration of nucleic acids discharged from *S. aureus* and *E. coli*.

Referring to FIG. 12F, it can be seen that a large amount of nucleic acid was discharged in the fiber-nanowire composite. Although *S. aureus* and *E. coli* were killed, a small red signal was detected with a fluorescence microscope because nucleic acid was discharged, and through this, it can be confirmed that a very large amount of nucleic acid was discharged in the fiber-nanowire composite due to cell death.

FIG. 13 shows the results of evaluating the antibacterial effects of a fiber-nanowire composite prepared in Preparation Example 3 and a fiber-nanowire composite prepared in Comparative Preparation Example 3.

Specifically, FIG. 13A is an SEM image of a fiber-nanowire composite (PLA MF-ZnO NW (surface)) prepared in Comparative Preparation Example 3, and FIG. 13B is an SEM image of a fiber-nanowire composite (PLA MF-ZnO NW (all growth)) prepared in Preparation Example 3. It can be seen that since water cannot penetrate the PLA MF-ZnO NW (surface) having hydrophobic characteristics, only the nanowires on the surface of the material can come into contact with the bacteria, so an antibacterial effect is not exhibited. On the other hand, since water can penetrate the PLA MF-ZnO NW (all growth) having superhydrophilic characteristics, the nanowires of the entire sheet can come into contact with the bacteria, so an excellent antibacterial effect is exhibited, and ruptured bacteria were observed.

In addition, FIG. 14 shows the results of evaluating the antibacterial effects of a fiber-nanowire composite against *S. aureus* and *E. coli* according to time.

FIGS. 14A and 14B are SEM images showing antibacterial effects against S. aureus and *E. coli*, respectively, and in the PLA MF-ZnO NW (all growth) of the present invention, *S. aureus* that had been perforated and died were observed, and *E. coli* with a ruptured cell membrane were observed, which are indicative of excellent antibacterial effects. In addition, since the PLA MF-ZnO NW (all growth) had superhydrophilic characteristics, water rapidly penetrates thereinto, so when a bactericidal experiment was performed, it can be confirmed that a bacteria solution rapidly penetrated into the sheet, exerting a penetrating force which caused the nanowires to greatly physically damage bacteria, thus causing the bacteria to be rapidly killed.

In addition, FIG. 14C shows antibacterial effects against *S. aureus* and *E. coli* according to time, and it can be confirmed that due to the hydrophilic characteristics and structural characteristics of the fiber-nanowire composite of the present invention, an excellent antibacterial effect was exhibited by effectively penetrating the cell membrane from an initial stage.

A representative conventional preparation method related to the preparation of a fiber-nanowire composite is a dip-coating method. In the dip-coating method, fibers are dipped in a solution containing nanoparticles for a predetermined period of time to attach the nanoparticles on the surface of the fibers. This is the most basic method and can be easily performed. However, in order to uniformly attach the nanoparticles to the fibers, it is necessary to precisely control the concentration of nanoparticles in the solution, a dipping time, an interaction between the nanoparticles and the fibers, and the like. In addition, the method has low reproducibility, and since the nanoparticles attached to the surface have low structural stability, additional processes such as heat treatment are required for immobilization.

The present invention provides a method which can overcome the disadvantages of the conventional dip-coating method. According to the method of the present invention, nanoparticles are embedded in fibers, so stability can be ensured, and it is possible to easily manufacture a composite in which the nanoparticles are uniformly dispersed on the inside and/or the surface of the fibers, and a sheet based on the same.

A fiber-nanowire composite of the present invention has antibacterial and antifouling effects, so it can be applied to a sheet and used as an antibacterial filter, an antibacterial film, an antiviral filter, an antiviral film, an antifouling coating, a drug delivery vehicle, or a water treatment filter. Furthermore, the fiber-nanowire composite can be applied to various fields according to the characteristics of nanoparticles and nanowires that can be included.

What is claimed is:

1. A method of manufacturing a fiber-nanowire composite-based sheet, comprising the steps of:
   electrospinning an electrospinning solution including metal nanoparticles or metal oxide nanoparticles and a polymer and thus preparing a fiber-nanoparticle composite;
   adding the fiber-nanoparticle composite to a nanowire synthesis solution containing metal ions and then performing sonication; and
   growing metal nanowires or metal oxide nanowires from metal nanoparticles or metal oxide nanoparticles located inside and/or on the surface of the fiber-nanoparticle composite,
   wherein the sonication is performed at an intensity of 1 kHz to 100 kHz for 1 second to 600 seconds.

2. The method of claim 1, wherein the metal or the metal oxide includes one or more selected from the group consisting of zinc oxide (ZnO), zirconium oxide ($ZrO_2$), aluminum oxide ($Al_2O_3$), manganese oxide ($MnO_2$), titanium oxide ($TiO_2$), copper oxide (CuO), tungsten oxide ($WO_3$), vanadium oxide ($V_2O_5$), iron oxide ($Fe_3O_4$), cobalt oxide ($Co_3O_4$), nickel oxide (NiO), nickel (Ni), copper (Cu), silver (Ag), and gold (Au).

3. The method of claim 1, wherein an average diameter of the metal nanoparticles or the metal oxide nanoparticles is in the range of 2 nm to 200 nm.

4. The method of claim 1, wherein the polymer includes one or more selected from the group consisting of polylactic acid (PLA), polyglycolic acid (PGA), polycaprolactone (PCL), poly(lactic-co-glycolic acid) (PLGA), polyhydroxybutyrate (PHB), polyurethane (PU), polyacrylonitrile (PAN), polyvinyl alcohol (PVA), polyethylene oxide (PEO), polyaniline (PANI), polystyrene (PS), polymethyl methacrylate (PMMA), polyvinylidene fluoride (PVDF), and polycarbonate (PC).

5. The method of claim 1, wherein an average diameter of the fiber is in the range of 50 nm to 5,000 nm.

6. The method of claim 1, wherein, in the nanowire synthesis solution, the metal ions include one or more selected from the group consisting of zinc ions ($Zn^{2+}$), zirconium ions ($Zr^{2+}$), aluminum ions ($Al_{3+}$), manganese ions ($Mn^{2+}$), itanium ions ($Ti^{2+}$), copper ions ($Cu^{2+}$), tungsten ions ($W^{6+}$), vanadium ions ($V^{4+}$), iron ions ($Fe^{2+}$, $Fe^{3+}$), cobalt ions ($Co^{2+}$, $Co^{3+}$), nickel ions ($Ni^{2+}$), silver ions ($Ag^+$), and gold ions ($Au^+$).

7. The method of claim 1, wherein the sonication is performed at an intensity of 1 kHz to 100 kHz for 1 second to 100 seconds.

8. The method of claim 1, wherein the growth of the metal nanowires or metal oxide nanowires is performed at a temperature of 30° C. to 99° C. for 1 minute to 1,200 minutes.

9. The method of claim 1, wherein a length of the metal nanowires or the metal oxide nanowires is in the range of 50 nm to 7,000 nm, and a diameter thereof is in the range of 10 nm to 500 nm.

* * * * *